(12) United States Patent
Gardner et al.

(10) Patent No.: US 6,200,862 B1
(45) Date of Patent: Mar. 13, 2001

(54) MASK FOR ASYMMETRICAL TRANSISTOR FORMATION WITH PAIRED TRANSISTORS

(75) Inventors: Mark I. Gardner, Cedar Creek; Frederick N. Hause; Michael P. Duane, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/188,085

(22) Filed: Nov. 6, 1998

(51) Int. Cl.[7] .................................................. H01L 21/336
(52) U.S. Cl. ........................ 438/279; 438/286; 438/291; 438/305
(58) Field of Search ..................................... 438/279, 286, 438/289, 290, 291, 303, 305, 306, 307

(56) References Cited

U.S. PATENT DOCUMENTS

| | | | |
|---|---|---|---|
| 4,992,389 | * 2/1991 | Ogura et al. | 438/279 |
| 5,286,664 | 2/1994 | Horiuchi | 437/44 |
| 5,541,436 | 7/1996 | Kwong et al. | 257/410 |
| 5,547,888 | * 8/1996 | Yamazaki | 438/279 |
| 5,674,788 | 10/1997 | Wristers et al. | 437/239 |
| 5,759,897 | 6/1998 | Kadosh et al. | 438/286 |
| 5,828,104 | * 10/1998 | Mizushima | 438/286 |
| 5,874,340 | 2/1999 | Gardner et al. | 438/286 |

OTHER PUBLICATIONS

Stanley Wolf, "Silicon Processing For The VLSI Era, vol. 2: Process Integration," Lattice Press, California, 1990, pp. 348–360, 436–440.

Stanley Wolf, "Silicon Processing For The VLSI Era, vol. 3: The Submicron MOSFET," Lattice Press, California, 1995, pp. 612–620.

* cited by examiner

*Primary Examiner*—Chandra Chaudhari
(74) *Attorney, Agent, or Firm*—Skjerven Morrill MacPherson LLP

(57) ABSTRACT

In a plurality of series-coupled IGFET devices, wherein each pair of devices in the series shares a common source/drain terminal, only the source/drain regions acting as drain terminals are provided with a lightly-doped region. The presence of the lightly-doped source/drain regions in the portions of the source/drain regions acting as drain terminals provides protection against "hot-carrier" effects. By not having lightly-doped portions in portions of the source/drain regions acting as sources, the resistance resulting from the presence of the additional lightly-doped portions of the remaining source/drain regions in the series of IGFET devices results in lower resistance experienced by the conduction current. According to a second embodiment of the invention, only the non-shared source/drain terminal acting as drain terminal is provided with a lightly-doped region. In this manner, a large portion of the "hot-carrier" effects are reduced, while the resistance to conduction current for the total resistance of the devices is lowered still further.

16 Claims, 3 Drawing Sheets

US 6,200,862 B1

MASK FOR ASYMMETRICAL TRANSISTOR FORMATION WITH PAIRED TRANSISTORS

CROSS-REFERENCE TO RELATED APPLICATIONS

This application is related to copending, commonly assigned, concurrently filed U.S. patent application Ser. No. 09/187,258), which names Mark I. Gardner and Mark C. Gilmer as inventors and is entitled "High Density MOSFET Fabrication Method With Integrated Device Scaling."

This application is related to copending, commonly assigned, concurrently filed U.S. patent application Ser. No. 09/187,894), which names Daniel Kadosh and Mark I. Gardner as inventors and is entitled "Asymmetric IGFET Devices With Spacers Formed By HDP Techniques."

BACKGROUND OF THE INVENTION

1. Field of the Invention

This invention relates generally to the fabrication of semiconductor integrated circuits and, more particularly, to the fabrication of insulated gate, field effect transistor (IGFET) devices.

2. Description of the Related Art

An insulated-gate field; effect transistor (IGFET) device 5, such as a metal-oxide semiconductor field-effect transistor (MOSFET) is shown in FIG. 1. A substrate 10 has a doped well region 12, a p-doped well region will be used for purposes of illustration, formed therein. The substrate 10 has a p-doped channel region 14 that provides a conducting path between the n-doped source/drain region 16A, 16B and the n-doped source/drain region 18A, 18B. The addition, an p-doped punch-through region 20 is provided below the channel region 14. Also formed in the substrate 10 are the isolation structures 22 and 24. The gate structure of the IGFET device 5 includes an gate dielectric layer, directly over the channel region 14, and a gate electrode 28 over the gate dielectric 26. The gate structure 26, 28 can include spacers 30, 32 formed against the walls of the gate structure 26, 28. An insulating layer 34 covers the substrate 10 and the gate structure 26, 28. The insulating layer 34 has vias formed therein and the vias are filled with a conducting material. The conducting material provides conducting vias 36 to source/drain (electrode) regions 16A, 16B and 18A, 18B and to the gate electrode 28. An insulating layer 38, formed over insulating layer 34, is patterned and the portions of the layer 38 that have been removed are filled with conducting material to provide conducting paths 40. The conducting paths 40 and the remaining insulating material 38 are the interconnect layer 38, 40, the interconnect layer providing the electrical coupling between the IGFET device 5 and the remainder of the integrated circuit.

The operation of the IGFET device 5 can be understood as follows. A voltage applied to the gate electrode 28 causes a transverse field in the channel region 14. The transverse field controls (e.g., modulates) the current flow between source/drain region 16A, 16B and source/drain region 18A, 18B. The punch-through region 20 is formed to prevent parasitic effects that can occur when this region is not formed in the device 5. The spacers 30, 32 and the dual-structured, doped source/drain regions 16A, 16B and 18A, 18B address a problem generally referred to as the "hot-carrier" effect. When only one source/drain region 16A and 18A is present and is formed by doping technique aligned with the electrode structure 26, 28, charge carriers from these regions can migrate into the channel region 14 and be trapped by the gate dielectric 26. These trapped charge carriers adversely effect the transverse electric field normally formed in the channel region 14 by a voltage applied to the gate electrode 28. The problem is alleviated by lightly-doping source/drain regions 16A and 18A by a technique that aligns this doping procedure with the gate structure 26, 28. Spacers 30 and 32 are next formed on the walls of the gate structure 26, 28. Source/drain regions 16B and 18B are formed by a doping procedure, resulting in source/drain doping concentrations at normal levels, that aligns the source/drain regions 16B and 18B with the spacers 30 and 32, respectively. (While this two level doping procedure effectively eliminates the "hot-carrier" problem, the resistance between the two source/drain dual regions 16A, 16B and 18A, 18B is increased.) The isolation structures 22, 24 provide electrical insulation the between the device 5 and other areas of the integrated circuit.

The use of the lightly-doped regions between the normally doped source/drain regions and the channel region provides relief from the "hot-carrier" effects, but the use of lightly-doped source/drain regions results in a higher effective resistance between the source/drain region and the channel region. This higher resistance results in a compromise of the operation of the device.

SUMMARY OF THE INVENTION

A need has therefore been felt for an IGFET device and technique for fabrication thereof having a feature of reducing the effects of "hot-carriers" effects. An additional desirable feature for such an IGFET device is that the resistance between the source/region electrode and the carrier region, that would normally result from the presence of lightly-doped source/drain regions, be reduced. A still further feature of the present invention is that, for a plurality of series-connected IGFET devices, only the source/drain terminal functioning as a drain of the IGFET device not connected to other device or devices in the series of devices has a lightly-doped source/drain terminal formed therewith.

The aforementioned and other features are accomplished, according to the present invention, by providing lightly-doped regions in the source/drain electrodes of selected IGFET devices, i.e., only for the electrodes of IGFET devices that function as drain electrode. A plurality of IGFET devices having device pairs each sharing a common source/drain region have asymmetricall) doped source/drain regions formed by lightly-doping both source/drain regions associated with a gate structure of an IGFET device. A patterned photoresist mask is formed that extends out from the gate structure only over one of the source/drain regions. Normally-doped source drain regions are then formed by ion implantation. A first type of normally-doped source/drain region is formed when the implanted ions are aligned by the gate structure. A second normally-doped source/drain region is aligned by the photoresist mask, the photoresist mask extending from the gate structure over a portion of the substrate. This second source/drain region is separated from the channel region by a lightly-doped source/drain region portion. This asymmetrically-doped IGFET device, i.e., with a first source/drain region being normally-doped and a second source/drain region having a normally-doped and a lightly-doped component, can be used when the second source/drain region functions as a drain electrode for the IGFET device in a plurality of coupled devices, wherein each pair of devices shares a common source/drain region. In a second embodiment, when a plurality of IGFET devices are connected in series, i.e., each device in the series sharing a common source/drain region, only the source/drain region not connected to another device in the series and functioning as a drain terminal is provided with the lightly doped source/drain region.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1:
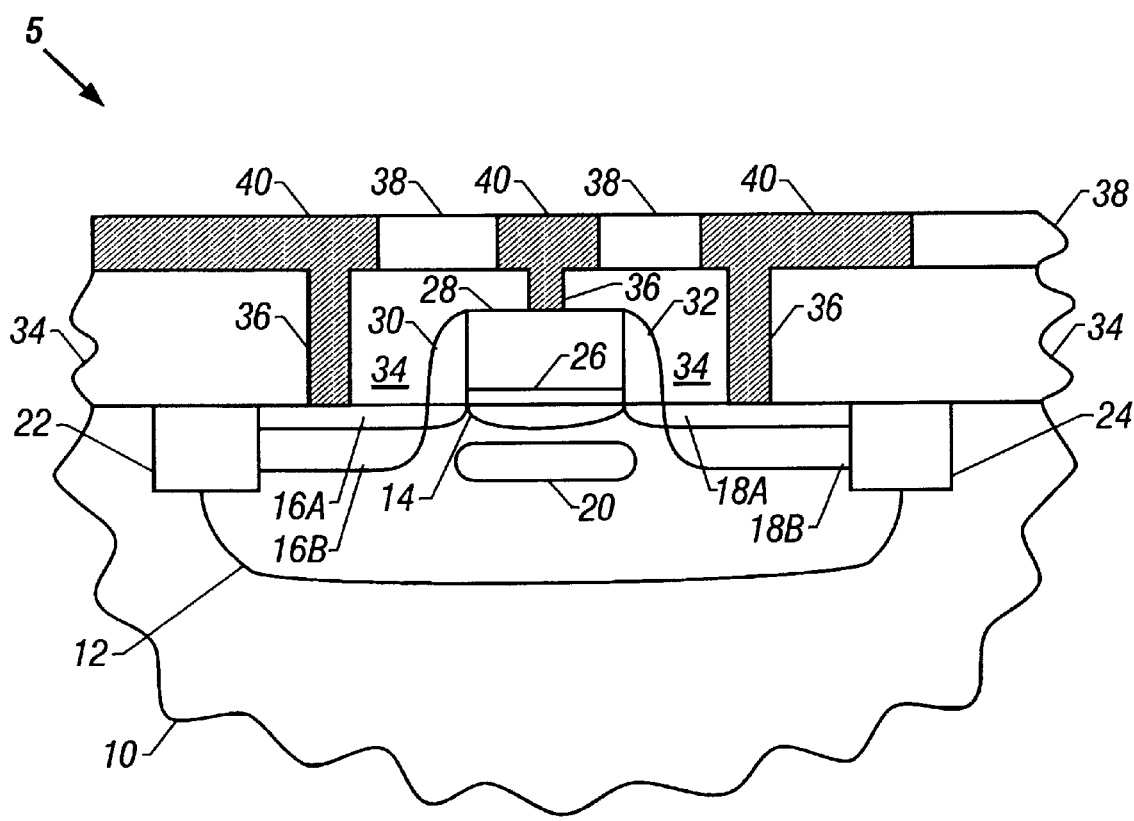
FIG. 1 is a cross-sectional view of an IGFET device according to the related art.

FIG. 1 has been discussed with respect to the related art.

Figure 2A:
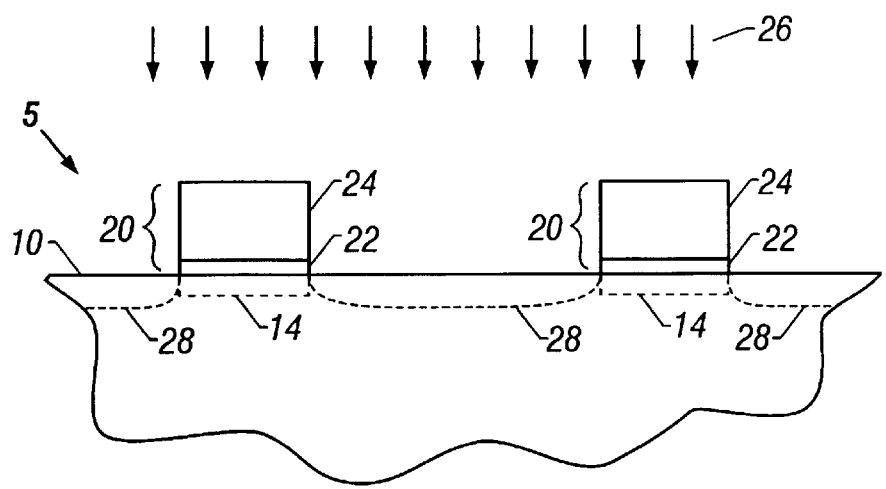
FIGS. 2A–2C illustrate a first embodiment for fabricating IGFET devices according to the present invention.

Referring now to FIG. 2A, a cross-sectional view of a partially fabricated pair of IGFET devices is shown. Substrate 10 has already had formed therein, e.g., by ion implantation, a channel region 14, a punch-through region, and a well region. (Only the channel region 14 is illustrated.) The substrate can be doped with arsenic or phosphorous ions to form an n-doped channel regions (or n-channel regions). The substrate can be doped with boron ions to form a p-doped channel (or p-channel) regions. The well and punch-through region will be formed with the same type of ions. In order to implant the ions at the desired doping concentration and depth levels, phosphorous ions are implanted to form a channel region with an approximate energy of 15 to 150 keV with a total ion density of approximately $1 \times 10^{12}$ to $1 \times 10^{13}$ ions/cm$^2$; are implanted to form a punch-through region with an approximate energy of 75 to 225 keV with a total ion density of approximately $1 \times 10^{12}$ to $1 \times 10^{13}$ ions/cm$^2$, and are implanted to form a well region with an approximate energy of 150 to 600 keV at a total ion density of approximately $1 \times 10^{12}$ to $1 \times 10^{13}$ ions/cm$^2$. To implant ions at the desired doping concentrations and depth levels, boron ions are implanted to form a channel region with an approximate energy of 5 to 50 keV at a total doping density of approximately $1 \times 10^{12}$ to $1 \times 10^{13}$ ions/cm$^2$ are implanted to form a punch-through region with an approximate energy of 25 to 75 keV at a total concentration of approximately $1 \times 10^{12}$ to $1 \times 10^{13}$ ions/cm$^2$, and are implanted to form a well region with an approximate energy of 50 to 200 keV at a total concentration of approximately $1 \times 10^{12}$ to $1 \times 10^{13}$ ions/cm$^2$. After formation of doped regions in the substrate 10, a gate dielectric layer 22, of 10–30 Å is formed by oxide growth, plasma deposition, or low pressure chemical vapor deposition. The gate dielectric is typically silicon oxide, silicon nitride, or silicon oxynitride. A gate electrode layer 24, typically comprising polysilicon or some other conducting material, is formed on the gate dielectric 22. A photoresist layer, not shown, is applied to the surface of the gate electrode layer. The photoresist layer is patterned to form a mask, and the portions of the gate electrode layer and the gate dielectric exposed by the patterned mask are subjected to an etching process. The etching process removes the gate electrode layer 24 material and the gate dielectric layer 22 material not shadowed by the photoresist mask. The result of this procedure is the formation of gate electrodes 20. The gate electrodes 20 are positioned over the doped channel regions 14 formed in the substrate 10. The substrate 10 and gate structure 20 are bombarded with ions 26 that will form a doped region having a opposite-type conductivity when compared to the type of conductivity of the channel regions 14. The resulting doped regions 28 are lightly doped source/drain regions 28, aligned by the gate structure 20, and extend to a position proximate the channel regions 14 of the devices. In the present invention, separate gate structures 20 share a common source/drain terminal. A rapid thermal anneal (RTA), e.g., 900 to 1050° C. for 5 to 30 seconds, brings the lightly-doped source/drain regions 28 into electrically-conducting contact with the channel regions 14.

Figure 2B:
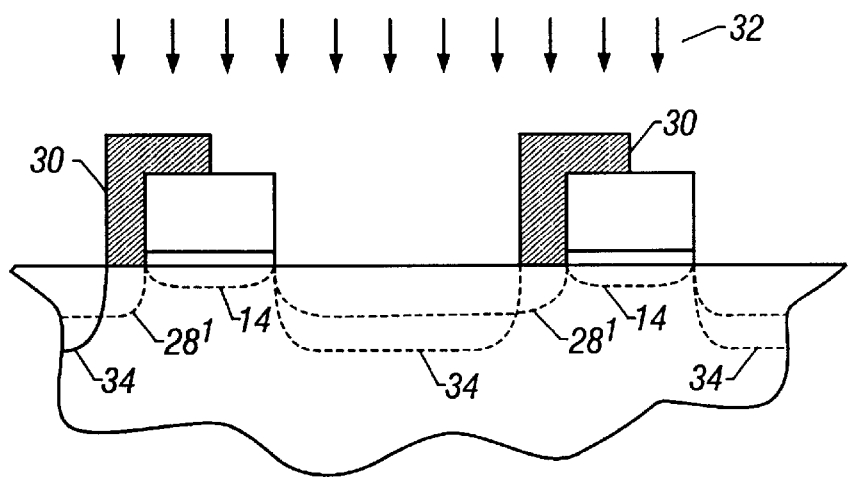

Referring next to FIG. 2B, a layer of material 30, typically a photoresist layer, is deposited on the gate structure 20 and on the exposed surfaces of the substrate 10. The photoresist layer 30 is patterned. The patterning of layer 30, as shown in FIG. 2B, covers an area of the surface of the source/drain region of the substrate 10 near the gate structure 20. When resulting intermediate device structure is subjected to ion bombardment 32, the substrate 10 region not shadowed by the gate structure 20 or by the mask 30 receives an ion implantation. The regions receiving the ion implantation become normally-doped source/drain regions 34. However, the regions shadowed by the remaining photoresist material 30 or the gate 20 do not receive additional ion implantation. In this manner, the channel region has a portion of the lightly-doped channel regions $28^1$ proximate one side of the gate structures 20. On the other side of the gate structures 20, the normally-doped source/drain regions 34 extend to the channel regions 14. After a rapid thermal anneal, e.g., 900 to 11000C for 5 to 30 seconds, the source/drain regions are in electrical contact with the channel regions. (The second rapid thermal anneal can also perform the function of the first rapid thermal anneal.) The resulting devices have asymmetric source/drain regions.

Figure 2C:
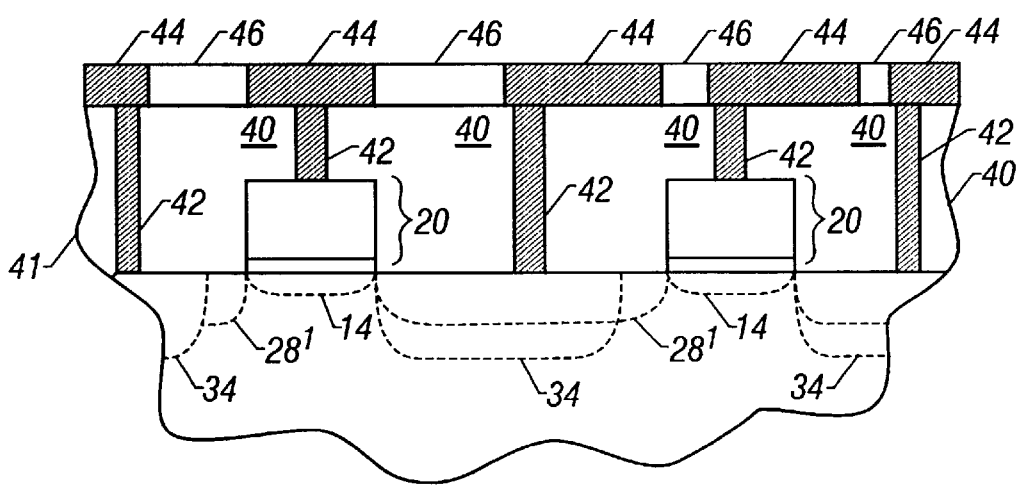

Referring to FIG. 2C, a cross-sectional view of a plurality of IGFET devices with asymmetric source/drain regions, after a multiplicity of additional processing steps, is shown. The photoresist regions 30 are removed and a dielectric layer 40, typically silicon oxide is formed and planarized. Vias are formed in the dielectric layer 40 exposing the surfaces of the substrate source/drain regions $28^1$, 34 and the surfaces of the gate electrode of gate structure 20. The exposed surfaces are typically prepared by a salication process whereby a layer of one of an appropriate group of metals, for example, cobalt or titanium, is applied to the devices and the devices subjected to a rapid thermal anneal at 550° C. to 700° C. in a nitrogen atmosphere. The result of the rapid thermal anneal is the formation of a salicide (e.g., $CoSi_2$ or $TiSi_2$).

The salicide provides a low resistance contact at the exposed portions of the source/drain regions 34, $28^1$ and the gate electrode 24. The excess metal is removed. The contact resistance can be lowered further by second rapid thermal anneal at 600° C. to 800° C., the second rapid thermal anneal providing a phase change that results in the lower contact resistance. After depositing a liner, for example, titanium or titanium nitride on the walls of the vias, the vias are filled with a conducting metal, for example polysilicon or tungsten, and the excess metal is removed. The conducting vias 42 have been formed. Another dielectric layer 46, such as silicon oxide, is formed on the surface of the dielectric layer 40 and the conducting vias 42. The dielectric layer 46 has channels formed therein. The channels are filled with a conducting material, for example, aluminum, to form conducting paths 44. The conducting paths 44 are electrically coupled to the conducting vias 42. The conducting paths 44 and the dielectric layer 46 are referred to as the first interconnect layer and, along with other interconnect layers (the interconnect layers being electrically coupled by conducting vias through a insulating layer), provide for the distribution of signals throughout the integrated circuit.

Figure 3A:
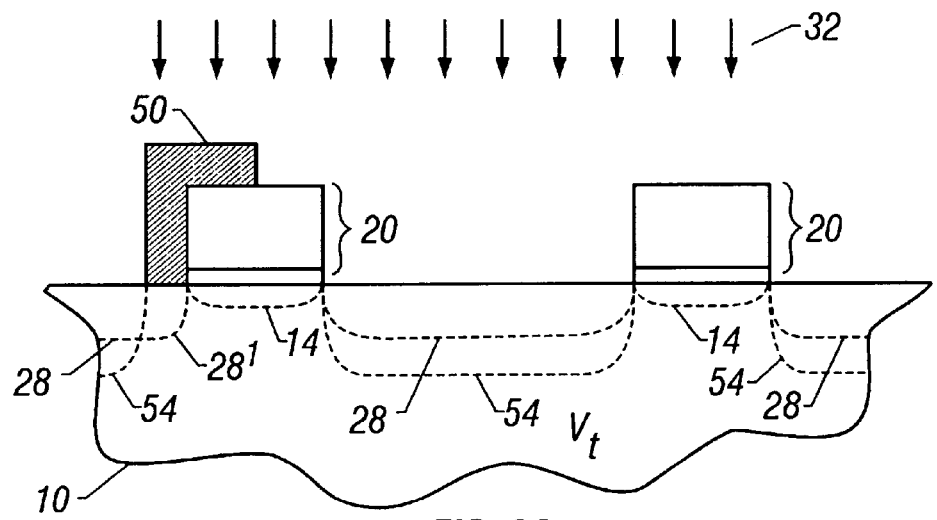
FIGS. 3A–3B illustrate a second embodiment for fabricating IGFET devices according to the present invention. The use of the same reference symbols in different drawings indicates similar or identical items.
Figure 3B:
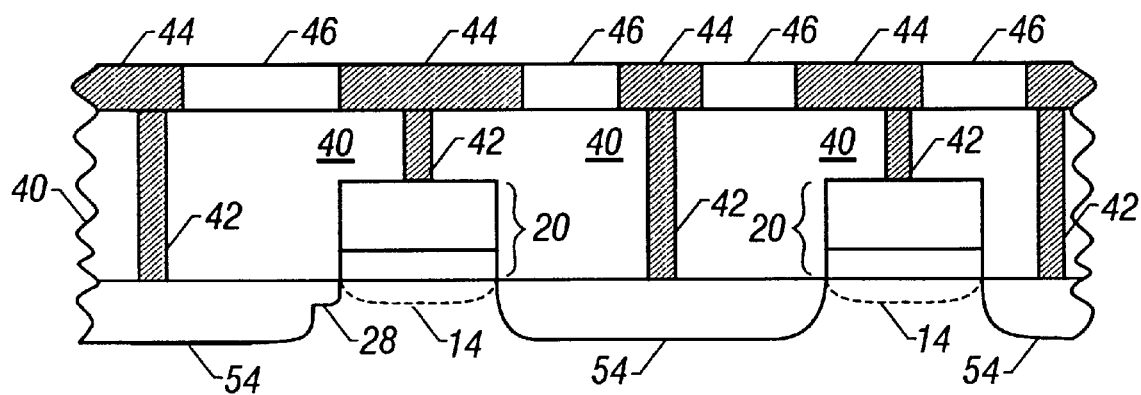

Referring next to FIGS. 3A and 3B, a second embodiment of the present invention is shown. FIG. 3A is similar to FIG. 2B, FIG. 2B illustrating part of the process in forming the first embodiment. The difference between FIG. 2B and FIG. 3A is that, in FIG. 3A, only one of the two IGFET devices sharing a source/drain region has the patterned photoresist layer 50 applied thereto. In particular, the patterned photoresist layer 50 is formed on the opposite side of the gate structure 20 (and the channel region 14) from the gate structure 20 side having the shared source/drain region. When the normal-level doping ion bombardment 32 is applied to the intermediate structure, the lightly-doped source/drain regions, not shadowed by the patterned photoresist layer 50, become normally doped regions 54. Only the source/drain region shadowed by the photoresist layer 50 retains a lightly-doped region $28^1$. The intermediate integrated circuit shown in FIG. 3A has the photoresist layer 50 removed and receives a rapid thermal anneal. The rapid thermal anneal electrically couples the source/drain regions and the associated channel regions.

FIG. 3B illustrates the result of a multiplicity of steps that will provide a functioning integrated circuit. These steps are summarized in the discussion of FIG. 2C.

The used of the lightly-doped source/drain regions in an IGFET, while reducing the "hot-carrier" effects, results in a higher resistance for the current path through the source/drain regions. In FIGS. 2A–2C, each of the IGFET devices has one of the lightly-doped regions in the current path removed, thereby lowering the resistance. The "hot-carrier" effects predominate for the high voltage regions, i.e., the source/drain regions acting as drain terminals. Therefore, for a plurality of IGFET devices coupled in series by sharing a common source/drain terminal and wherein the same source/drain regions act as drain terminals during the operation of the plurality of devices, the operation of the plurality of devices can be improved by eliminating the lightly-doped source/drain region portions in the regions acting as source terminals. And, with respect to FIGS. 3A–3B, the operation of the plurality of IGFET devices, coupled in series by each pair of IGFET devices sharing a common source/drain terminal, and subject to the condition that the same terminals will function as either as a source terminal or as a drain terminal during the operation of the device, the performance of the plurality of coupled IGFET devices can be further improved when only the unshared source/drain region acting as a drain terminal has a lightly-doped region between normally-doped source/drain region and the channel region.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A method of fabricating a plurality of insulated gate, field effect transistor (IGFET) devices, said plurality of devices coupled electrically in series, each neighboring pair of said devices sharing source/drain region, said plurality of devices having end devices with at least a first and a second unshared source/drain region; said method comprising:

forming at least one lightly-doped source/drain region including a lightly-doped drain region in said first unshared source/drain region;

applying a protective layer over at least a portion of said lightly-doped drain region in said first unshared source/drain region; and forming normally-doped source/drain region portions in source/drain region portions not protected by said protective layer including a portion of said second source/drain region proximate a channel region of an associated end device.

2. The method as recited in claim 1 wherein said forming further includes implanting ions in said substrate by ion bombardment.

3. The method as recited in claim 1 wherein said applying includes applying a protective layer over a portion of each said shared lightly-doped source/drain regions.

4. The method as recited in claim 3 wherein said applying includes applying said protective layer over said portion of each said shared lightly-doped source/drain regions, wherein said portion is proximate a channel region of a device for a shared source/drain region acting as a drain terminal.

5. The method as recited in claim 1 wherein said forming lightly-doped region portion further includes:

doping selected regions of a substrate with ions having parameters to provide lightly-doped selected regions, said selected regions included in said source/drain regions, said selected regions being determined at least by gate structures forming a part of each of said devices.

6. The method of fibricating a plurality of IGFET devices, said method comprising:

forming at least two channel regions, at least two punchthrough regions and a well region in a substrate;

forming a gate structure on said substrate proximate each channel region;

forming a shared lightly-doped source/drain region between and proximate to each pair of neighboring channel regions, wherein each shared lightly-doped source/drain region includes a first portion proximate a first of a pair of said channel regions and a second portion proximate a second of said pair of said channel regions, and forming unshared end lightly-doped source/drain regions in end unshared source/drain regions;

applying a protective layer over at least a first portion of a selected shared lightly-doped region; and forming normally-doped source/drain regions in all source/drain region portions not protected by said protective layer including a second portion of said selected shared lightly-doped source/drain region.

7. The method as recited in claim 6, wherein said applying includes applying said protective layer over a portion of a first unshared end lightly-doped source/drain region in a first unshared source/drain region proximate an end channel region, wherein said forming normally-doped source/drain regions in all source/drain region portions not protected by said protective layer includes portions of said first unshared end lightlydoped source/drain region and wherein said first end source/drain region protected portion functions as a drain terminal.

8. The method as recited in claim 7 wherein said applying includes applying a protective layer over a first portion of a shared lightly-doped source/drain region and wherein said first portion of said shared lightly-doped source/drain region is proximate a channel region for which said shared source/drain region functions as a drain terminal.

9. The method as recited in claim 6 wherein said plurality of devices is electrically coupled in series.

10. The method as recited in claim 6 further comprising:
   removing said protective layer;
   forming an insulating layer over said substrate and said gate structure;
   forming conducting vias through said insulating layer, said conducting vias electrically contacting said source/drain region and said gate structure.

11. The method as recited in claim 7 further comprising:
   removing said protective layer;
   forming an insulating layer over said substrate and said gate structure;
   forming conducting vias through said insulating layer, said conducting vias electrically contacting said source/drain region and said gate structure.

12. The method as recited in claim 6 wherein said forming lightly-doped source/drain regions and said forming normally-doped source drain regions include implanting ions in said substrate by ion bombardment.

13. The method as recited in claim 1 wherein said forming at least one lightly-doped source/drain region further includes forming a lightly-doped source/drain region portion in the portion of said second unshared source/drain region proximate a channel.

14. The method as recited in claim 1 wherein said portion of said lightly-doped drain region in said first unshared region includes a portion of said first unshared drain region proximate said channel.

15. The method as recited in claim 1 wherein said forming normally-doped source/drain regions in source/drain regions includes forming normally-doped portions proximate all channels except for a portion in said first unshared region proximate to said channel region.

16. A method of fabricating a plurality of IGFET devices, said plurality of devices coupled electrically in series, each neighboring pair of said devices sharing source/drain region, said plurality of devices having end devices with at least a first and a second unshared source/drain region; said method comprising:
   forming a shared lightly-doped source/drain region between and proximate to a pair of neighboring channel regions, wherein said shared lightly-doped source/drain region includes a first portion proximate the first of a pair of said channel regions and a second portion proximate the second of said pair of said channel regions;
   applying a protective layer over at least said first portion; and
   forming normally-doped source/drain regions in source/drain region portions not protected by said protective layer including said second portion proximate the second of said pair of said channel regions.

* * * * *

UNITED STATES PATENT AND TRADEMARK OFFICE
CERTIFICATE OF CORRECTION

PATENT NO. : 6,200,862 B1
DATED : March 31, 2001
INVENTOR(S) : Duane, Michael P.; Gardner, Mark I; Haus, Frederick N It is certified that error appears in the above-identified patent and that said Letters Patent is hereby corrected as shown below:

Column 1,
Line 25, please delete "field; effect" and insert -- field-effect --.

Column 6,
Line 35, please delete "fibricating" and insert -- fabricating --.

Signed and Sealed this

Twentieth Day of November, 2001

Attest:

*Nicholas P. Godici*

NICHOLAS P. GODICI
*Attesting Officer*   *Acting Director of the United States Patent and Trademark Office*